United States Patent [19]

Mishina et al.

[11] Patent Number: 4,776,105

[45] Date of Patent: Oct. 11, 1988

[54] APPARATUS FOR FIXING ELECTRONIC PARTS TO PRINTED CIRCUIT BOARD

[75] Inventors: Haruo Mishina, Ushiku; Yukio Yamada, Katsuta; Noriaki Mukai, Toride; Yushi Takahashi, Ibaraki, all of Japan

[73] Assignee: Hitachi Techno Engineering Co., Ltd., Tokyo, Japan

[21] Appl. No.: 944,572

[22] Filed: Dec. 22, 1986

[30] Foreign Application Priority Data

Dec. 23, 1985 [JP] Japan ............................. 60-287739
Dec. 23, 1985 [JP] Japan ............................. 60-287895

[51] Int. Cl.$^4$ ............................................. F26B 15/18
[52] U.S. Cl. ........................................... 34/78; 34/242
[58] Field of Search ................ 34/73, 74, 75, 77, 78, 34/242

[56] References Cited

U.S. PATENT DOCUMENTS

| | | | |
|---|---|---|---|
| 3,421,211 | 1/1969 | Eaves et al. | 34/78 |
| 3,904,102 | 9/1975 | Chu et al. | 34/77 |
| 4,150,494 | 4/1979 | Rothchild | 34/77 |
| 4,389,797 | 6/1983 | Spigarelli | 34/73 |
| 4,411,075 | 10/1983 | Blaudszun | 34/77 |
| 4,612,712 | 9/1986 | Pescatore et al. | 34/78 |
| 4,628,616 | 12/1986 | Shirai et al. | 34/78 |
| 4,634,000 | 1/1987 | Plapp | 34/78 |
| 4,658,513 | 4/1987 | Straftman | 34/73 |
| 4,698,915 | 10/1987 | Dickinson | 34/78 |

*Primary Examiner*—Larry I. Schwartz
*Attorney, Agent, or Firm*—Antonelli, Terry & Wands

[57] ABSTRACT

An apparatus for fitting electronic parts to a printed circuit board is disclosed which comprises a collector for collecting thermal medium adhered to a conveyor that is travelling out of a vapor tank. Thus, it is possible to prevent generation of poisonous gas and to enhance a safety aspect of the apparatus. Also, since it is possible to collect the thermal medium, the running cost may be reduced.

9 Claims, No Drawings

APPARATUS FOR FIXING ELECTRONIC PARTS TO PRINTED CIRCUIT BOARD

BACKGROUND OF THE INVENTION

1. Field of the Invention

The present invention relates to an apparatus for fixing electronic parts to a printed circuit board or substrate, and more particularly to an apparatus suitable for attaching to a high density printed circuit board a variety of electronic parts such as resistors, capacitors, and so-called flat packaged elements from which four-way electrode terminals are extracted in a planar manner.

2. Description of the Prior Art

Recently, a higher density attachment of electronic parts to a printed circuit board has been developed. Since a soldering or brazing operation to attaching electronic parts such as semiconductor chips to a printed circuit board is attained in a final step of the working line, a performance of the electronic parts largely depends upon a quality of the soldering work. Thus, the soldering technique becomes the most important and significant technique in various works in the manufacturing line.

At present, a soldering apparatus has been proposed which employs a vapor having a large specific weight relative to that of air as thermal medium and heats material to be processed by utilizing its condensing latent heat, in view of needs to enhance a uniformity of temperature distribution within a soldering work furnace and to avoid an undesirable excessive heating of the electronic parts. More specifically, the thermal medium used in such a vapor tank generally comprises fluorine system inactive organic agent. Its saturated vapor may have a large specific weight (relative to that of the air) of about 20 times, with its molecular weight being at about 820 g/mol under an intended temperature/pressure condition.

Thus, the thermal medium is very expensive, and variety of collecting means for collecting and reusing the vapor are proposed.

In this apparatus, the electronic parts are mounted on a soldering pattern on the printed circuit board, and the printed circuit board is caused to pass through saturated vapor of a thermal medium having a large specific weight relative to that of air as described above, by delivering means such as a conveyor, so that the solder on the board is heated and molten. As a result, the electronic parts are soldered on the printed circuit board. Thus, the apparatus has a vapor tank which is a so-called vapor reflow reservoir.

Such an apparatus suffers from the following disadvantages.

(1) When the conveyor passing through the cooling chamber is again introduced into a preheating chamber, a liquefied thermal medium stuck to the conveyor is heated by a preheater so that a part of the thermal medium is vaporized. When the vapor of the thermal medium is brought into contact with a heating surface of the preheater, a poisonous gas would be generated. Thus, there is a safety problem.

(2) A part of the thermal medium condensed and liquefied within the vapor generating tank or reservoir is adhered to th solder member to be soldered as the conveyor and is introduced together therewith into the cooling chamber, so that the part of the thermal medium is stagnant on the lower side of the cooling chamber or discharged to the outside. Since the liquefied thermal medium has a large density even if its volume is small, the total weight of the liquefied thermal medium is much larger than that of the vapor thereof. In addition, the thermal medium is very expensive, which increases a running cost and has an adverse effect in economical aspect.

Incidentally, such conventional apparatus is disclosed in, for example, U.S. Pat. No. 4,389,797.

SUMMARY OF THE INVENTION

An object of the present invention is to provide an apparatus for fixing electronic parts to a printed circuit board, in which any poisonous gas is prevented from being generated.

Another object of the present invention is to provide an apparatus for fixing electronic parts to a printed circuit board, in which a running cost is reduced.

These and other objects of the present invention are attained by providing an apparatus for fixing electronic parts to a printed circuit board, which comprises a vapor tank for carrying out a soldering work by bringing a saturated vapor of thermal medium into contact with a material to be processed and delivered by a conveyor and by heating and melting a solder of the material to be processed, a preheating chamber provided on an inlet side of the vapor tank, a cooling tank provided on an outlet side of the vapor tank, and a delivery path through which the material to be processed is fed into and discharged from the vapor tank, wherein there is further provided a collecting means for collecting the thermal medium adhered to the conveyor moved out of the vapor tank.

DESCRIPTION OF THE PREFERRED EMBODIMENTS

The present invention will now be described with reference to the accompanying drawings.

Figure 1:
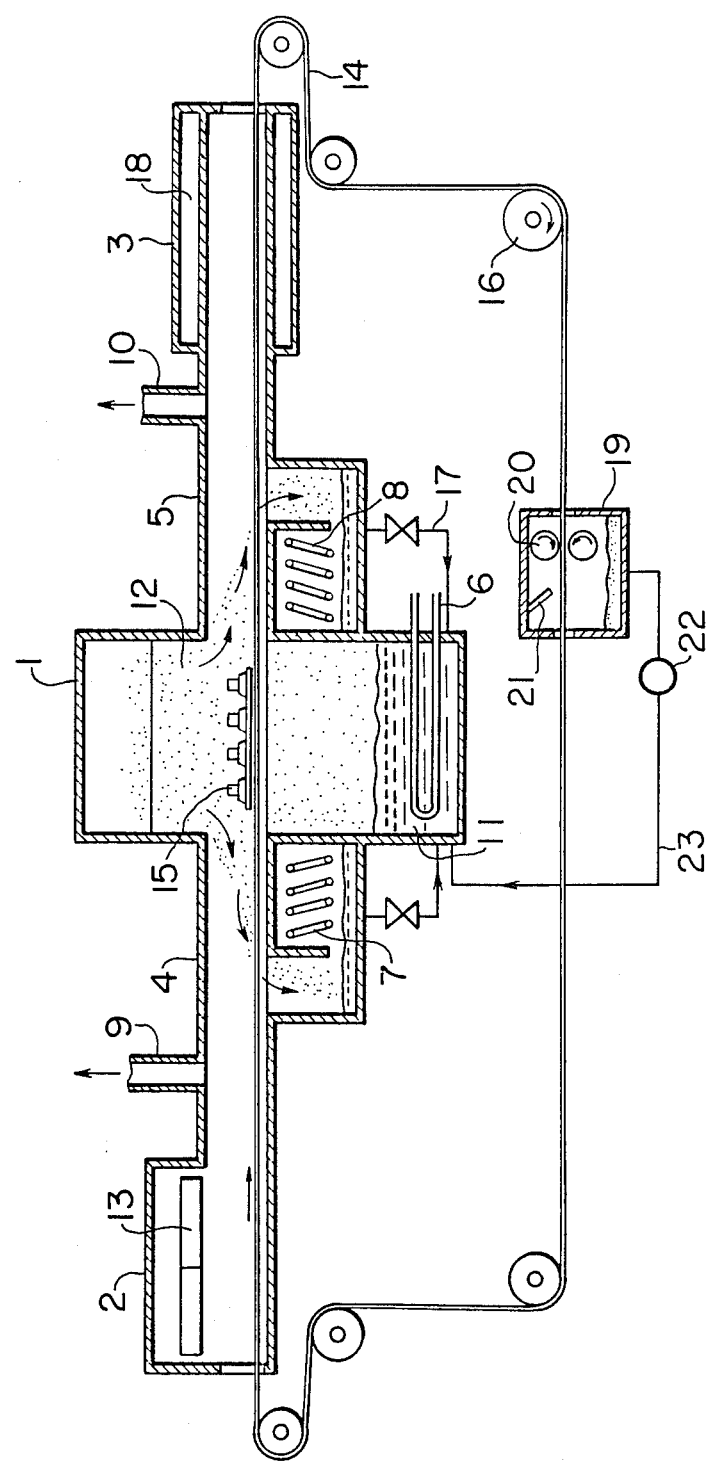
FIG. 1 is a cross-sectional view showing an apparatus for fixing electronic parts to a printed circuit board in accordance with an embodiment of the invention.

In FIG. 1, there is shown a vapor tank generally designated by reference numeral 1, composed integrally of a vapor generating tank for boiling and heating thermal medium 11 and a furnace tank section for heating and melting a solder on a material to be processed. The vapor reflow type apparatus comprises a preheat chamber 2 having a preheater 13, a cooling chamber 3 composed of a cooling jacket 18, an inlet side delivery path 4 through which the material to be processed, that is, a solder member 15 is fed into the vapor chamber 1, an outlet side delivery path 5 through which the processed material, that is, the solder member 15, is discharged, a heater 6 disposed in a lower portion of the vapor tank 1, that is, the vapor generating tank section, an inlet side cooling coil 7 provided at an outer periphery of the inlet side delivery path 4, an outlet side cooling coil 8 provided at an outer periphery of the outlet side delivery path 5, an inlet side vent port 9, an outlet side vent port 10, and a conveyor 14 for carrying and delivering the solder member 15. The conveyor 14 is driven by a drive roller 16.

A collecting means 19 for collecting the thermal medium adhered to the conveyor travelling out of the cooling chamber 3 is interposed between the preheating chamber 2 and the cooling chamber 3. The collecting means 19 is composed of rotary brushes 20 and an air knife 21. The thermal medium stagnant on the lower side of the collecting means 19 is returned back to the vapor generating tank section of the vapor tank through a return pipe 23 by a pump 22. The operation of the vapor reflow type soldering apparatus thus constructed in accordance with the embodiment will now be explained.

After the solder member 15 fed into the preheating chamber 2 by the conveyor 14 has been heated by the preheater 13, the solder member 15 is introduced into the vapor tank 1 through the inlet side delivery path 4. The thermal medium 11 stagnant in the bottom portion of the vapor tank 1, that is the vapor generating tank, is heated by the heater 6 to be boiled and evaporated so that the saturated vapor 12 of the thermal medium is raised upwardly. A part of the vapor eeats the lower surface of the solder member 15 and the rest thereof heats the upper surface of the solder member 15. At this time, a part of the saturated vapor 12 is condensed and liquefied to fall down and is returned back to the thermal medium reservoir section of the vapor generating tank, whereas the rest of the vapor is leaked into the inlet side delivery path 4 and the outlet side delivery path 5. Then, the solder member 15 in which the soldering process has been accomplished is delivered into the cooling chamber 3 through the outlet side delivery path 40 and is cooled to a temperature at which the subsequent work is not adversely effected. Then the solder member 15 is discharged to the outside.

Subsequently, the conveyor 14 travelling out of the cooling chamber 3 is again returned back to the preheating chamber 2 by the drive roller 16. At this time, the liquefied thermal medium adhered to the conveyor 14 is collected by the collecting means 19. More specifically, the thermal medium adhered to the conveyor 14 is collected by the actions of the rotary brushes 20 and the air knife 21, and the collected thermal medium is returned back into the vapor generating tank through the return pipe 23.

As described above, since the conveyor 14 travelling out of the cooling chamber 14 is introduced into the preheating chamber 2 past the collecting means 19, the liquefied thermal medium adhered to the conveyor 14 after being condensed and liquefied within the vapor tank is removed before the preheating chamber 2. Therefore, a problem such that a poisonous gas would otherwise be generated by the contact of the thermal medium with the heater may be eliminated.

Figure 2:
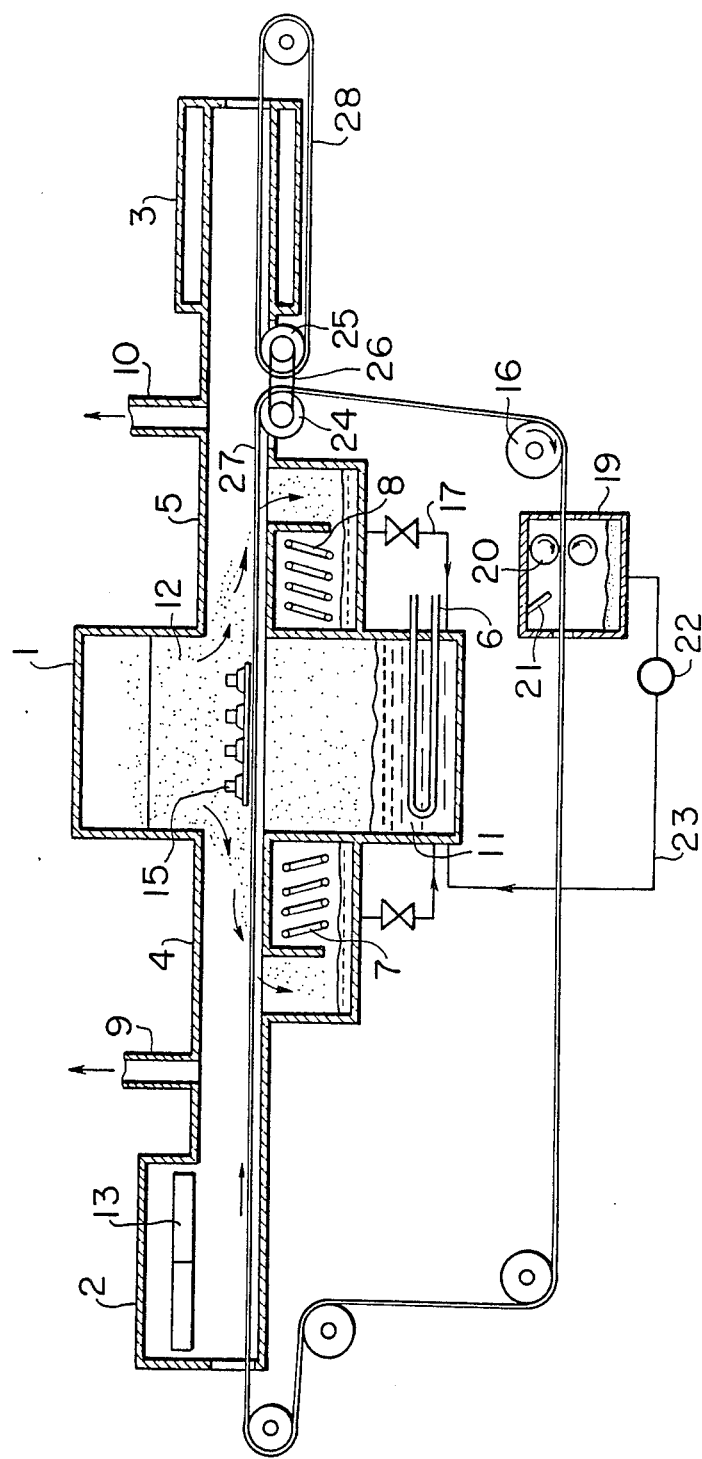
FIG. 2 is a cross-sectional view showing another embodiment of the invention.

FIG. 2 shows a cross-sectional view of an apparatus in accordance with another embodiment.

FIG. 2 shows the embodiment in which the conveyor is divided into one conveyor for the preheat chamber 2, the inlet side delivery path 4, the vapor tank 1 and the outlet side delivery path 5 and another conveyor for the cooling chamber 3 while their travelling speeds are in synchronism with each other.

In FIG. 2, there are shown synchronous rollers 24 and 25, and a first conveyor 27 travelling through the preheating chamber 2, the inlet side delivery path 4, the vapor tank 1 and the outlet side delivery path 5. The conveyor 27 is driven by the drive roller 16. A second conveyor 28 travelling through the cooling chamber 3 is driven by the drive roller 16 through a synchronous belt 26 for synchronizing the travelling speeds of the conveyors 27 and 28 with each other.

As described above, since the conveyor system is divided into the two conveyors 27 and 28 and the collecting means 19 is interposed in the conveyor 27 between the outlet side delivery path 5 and the preheating chamber 3, the generation of the poisonous gas is of course prevented. Also, since the relatively high temperature conveyor 27 that has passed through the outlet side delivery path 5 is provided with the collecting means 19, the liquefied thermal medium that has a relatively low viscosity may be collected, thereby improving the collection efficiency, reducing a consumption of the expensive thermal medium and enhancing an economical efficiency.

Figure 3:
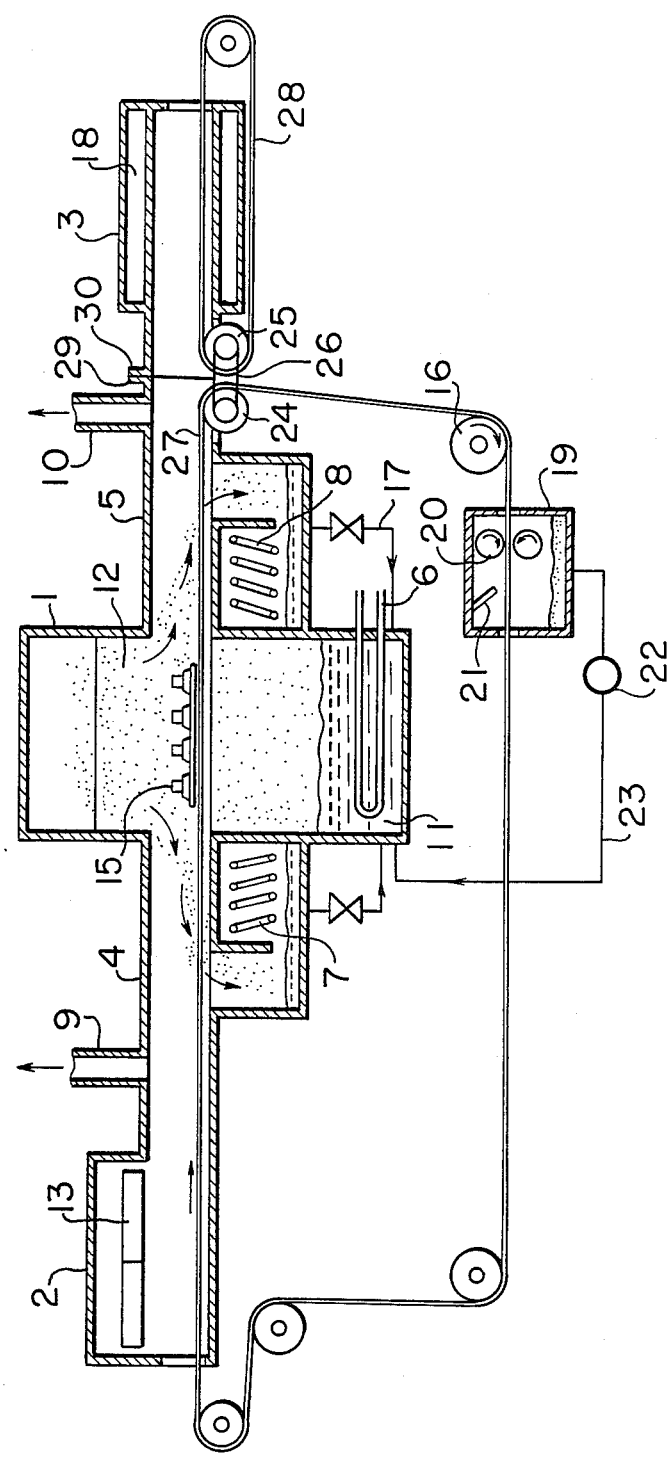
FIG. 3 is a cross-sectional view showing still another embodiment of the invention.

FIG. 3 shows another embodiment of the invention, in which the overall system is divided by separatable flanges 29 and 30 in correspondence with the conveyors divided shown in FIG. 2.

Figure 4:
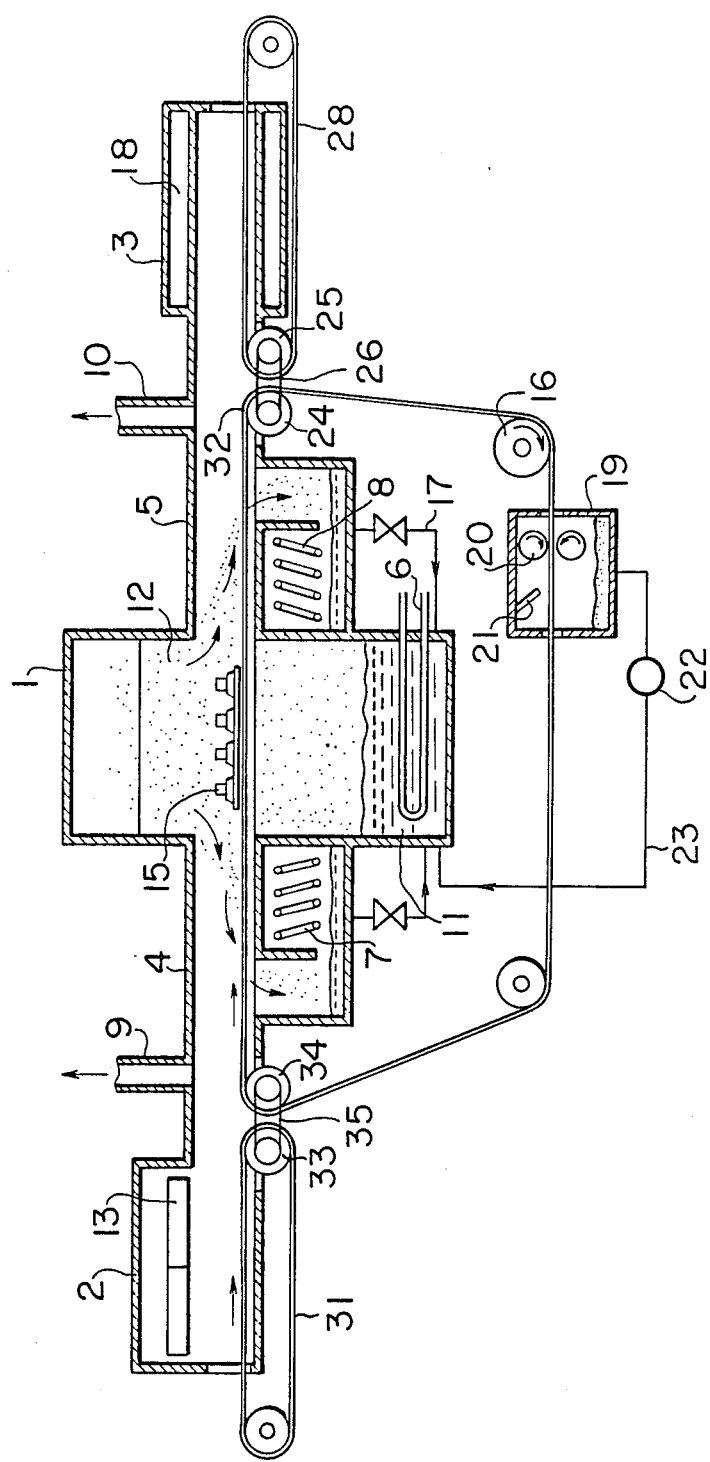
FIG. 4 is a cross-sectional view showing still another embodiment of the invention.

FIG. 4 shows still another embodiment of the invention, in which the conveyor system is divided into a first one for the preheating chamber, a second one for the inlet side path 5 and a third one for the cooling chamber 3 while their travelling speeds are in synchronism with each other.

In FIG. 4, there are shown synchronous rollers 24, 25, 33 and 34, synchronous belts 26 and 35, and conveyors 28, 31 and 32.

Thus, the conveyor system is divided into the three conveyors 28, 31 and 32 so that the conveyor 32 does not pass through the preheating chamber 2 or the cooling chamber 3. Therefore, the liquefied thermal medium adhered to the conveyor 32, condensed and liquefied in the vapor tank will not enter the preheating chamber. In this case, the collecting means 19 may be dispensed with if the generating of the poisonous gas is prevented. In the case where the collecting means 19 is provided in the system, it is possible to enhance the economic aspect as described above.

Figure 5:
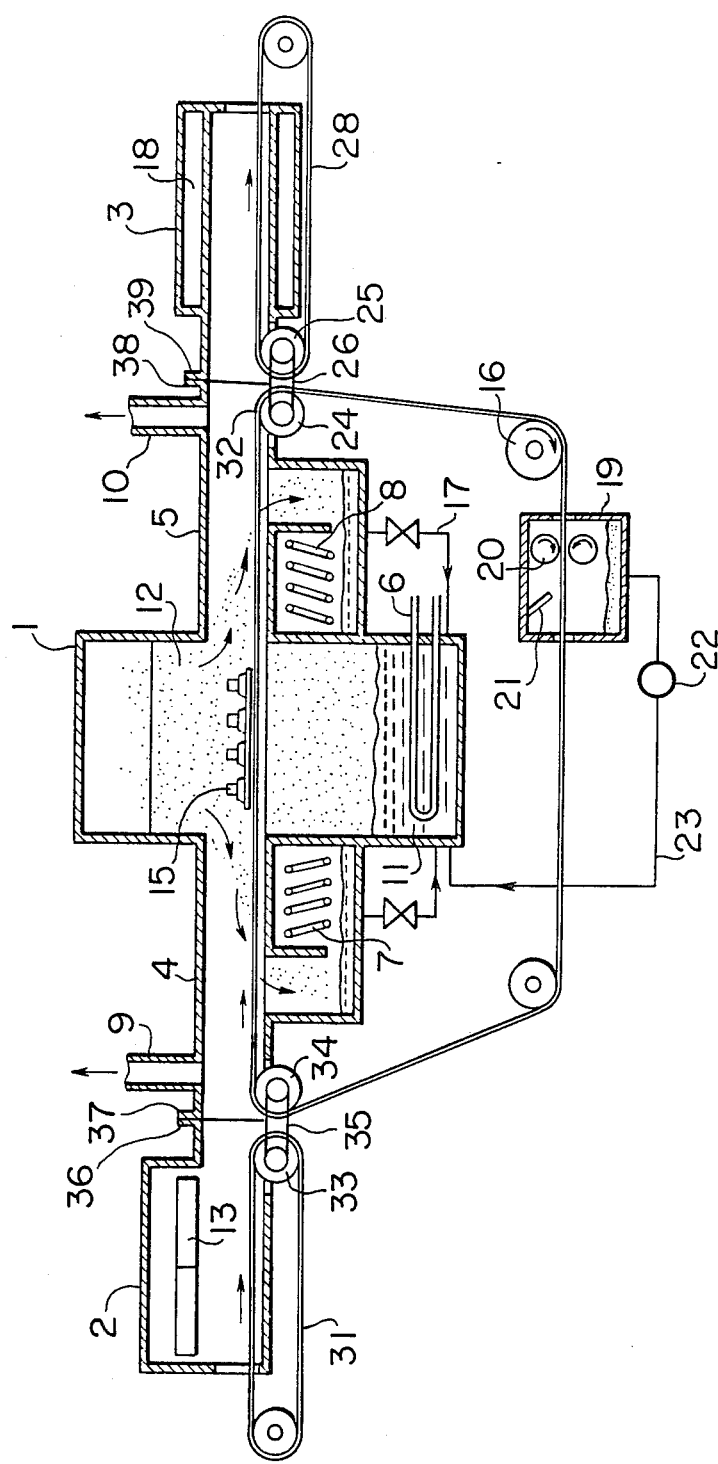
FIG. 5 is a cross-sectional view showing still another embodiment of the invention.

FIG. 5 shows another embodiment of the invention, in which the apparatus is divided by separatable flanges 36, 37, 38 and 39 corresponding to the conveyors 28, 31 and 32.

The apparatus is thus divided into three sections, so that it is easy to install the apparatus even if the inlet of the apparatus is small or the apparatus is to be installed on a high floor of a building. Also, since the conveyor system is divided for the preheating chamber 2, the vapor tank 1 and the cooling chamber 3, respectively, it is possible to suitably select material for the respective conveyors in view of functions and conditions of the respective chambers, thereby improving the productivity and economic efficiency.

Figure 6:
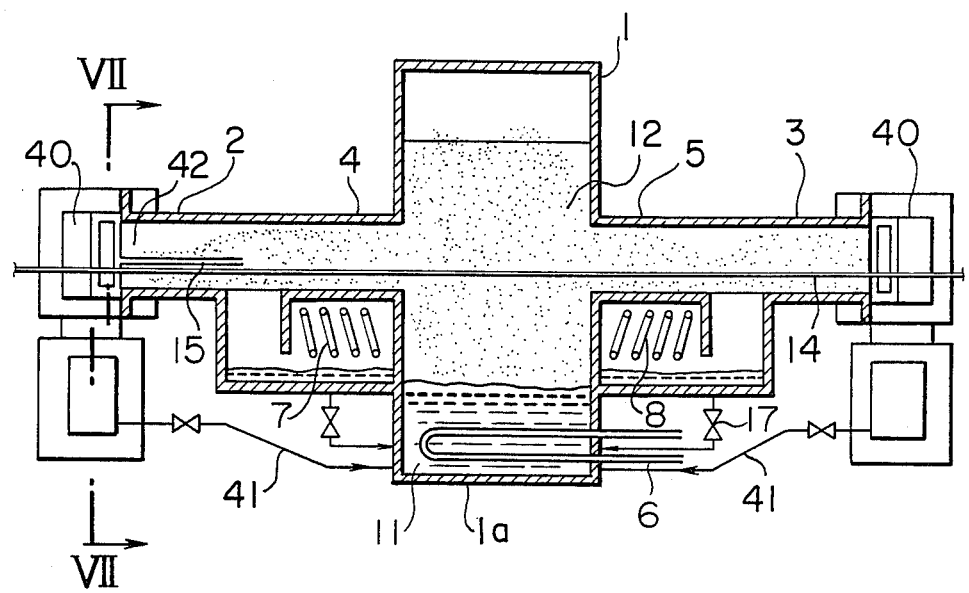
FIG. 6 is a cross-sectional view showing still another embodiment of the invention.
Figure 7:
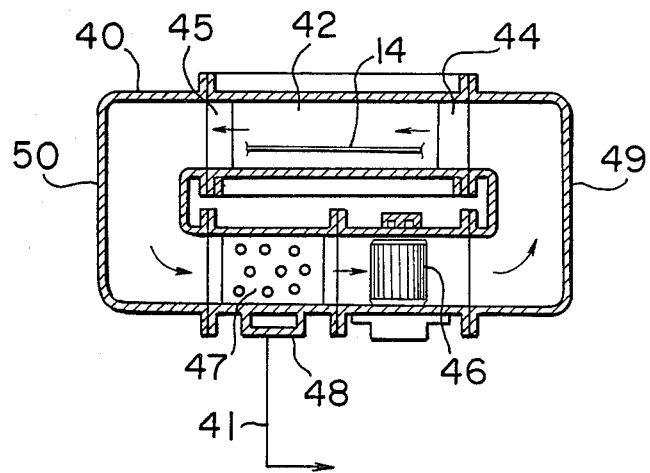
FIG. 7 is a cross-sectional view taken along the line VII—VII of FIG. 6.
Figure 1:
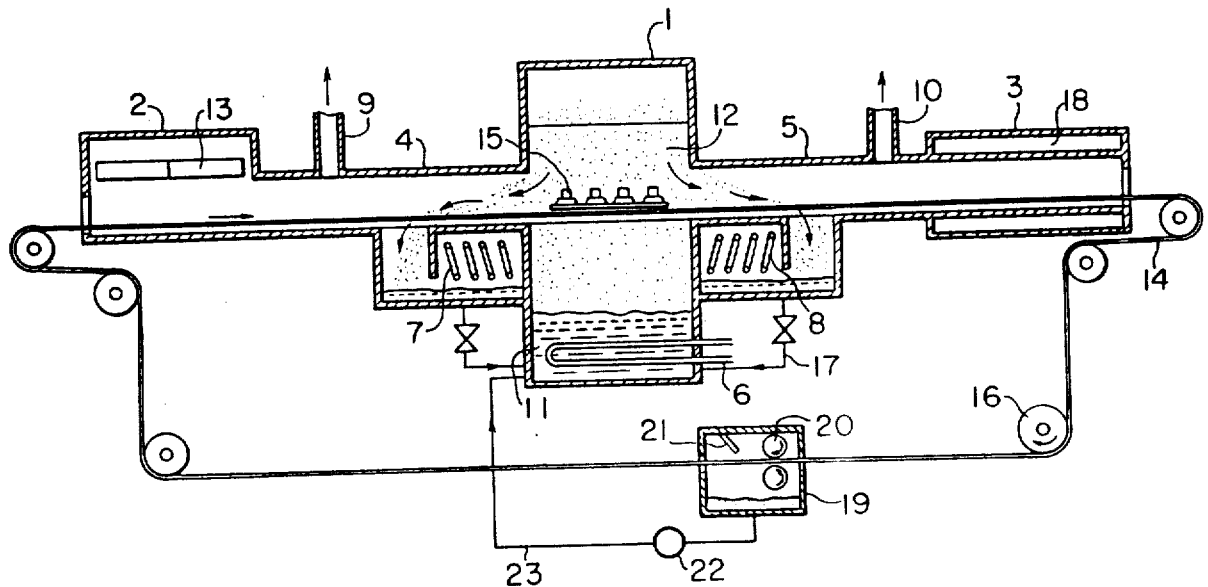
Figure 2:
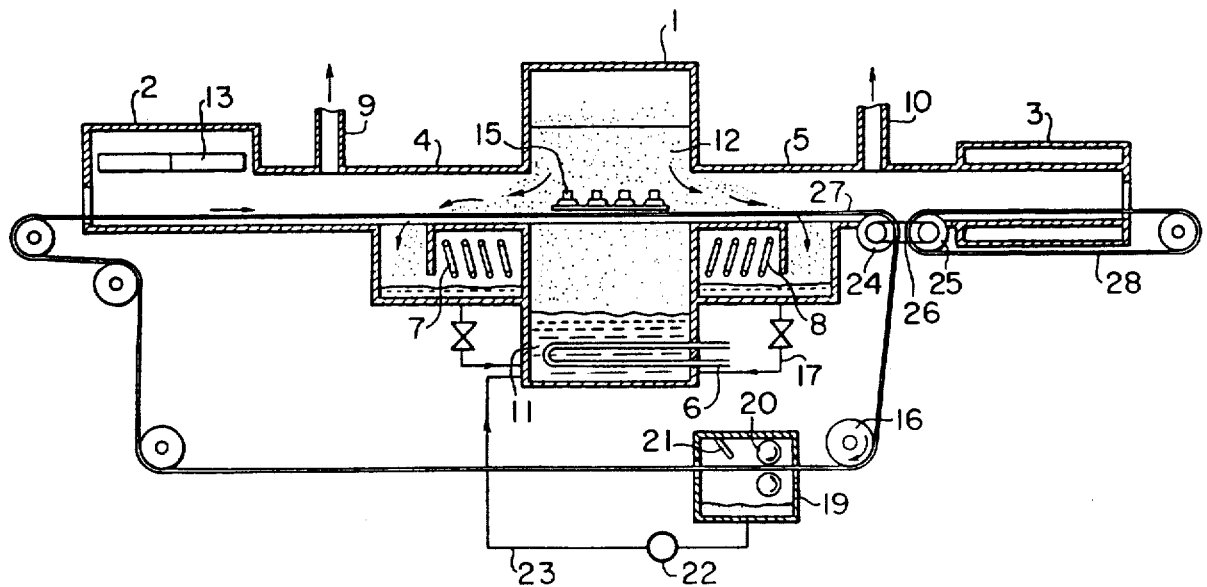
Figure 3:
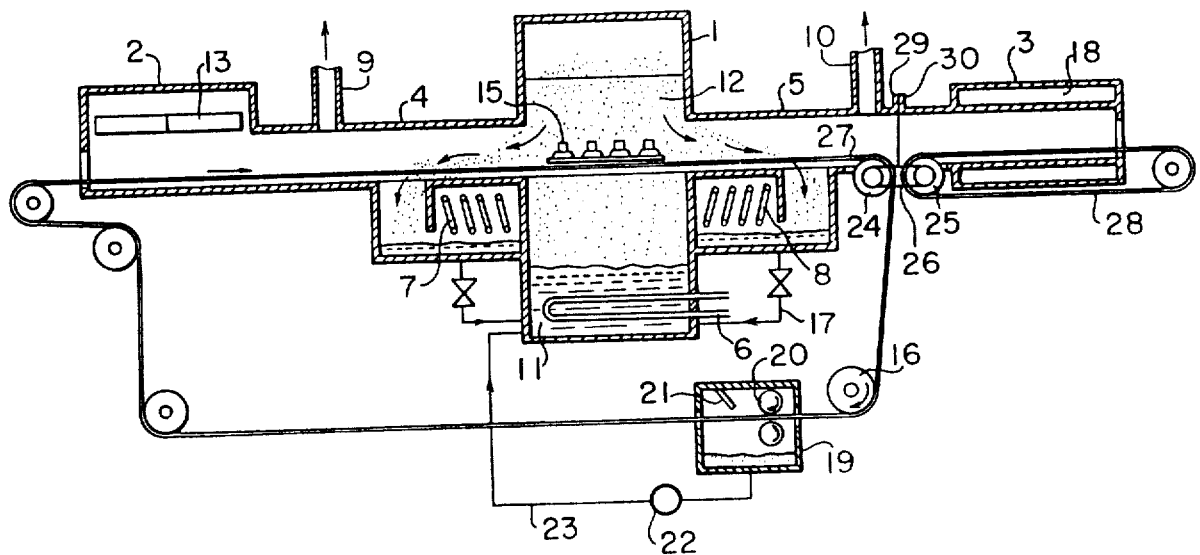
Figure 4:
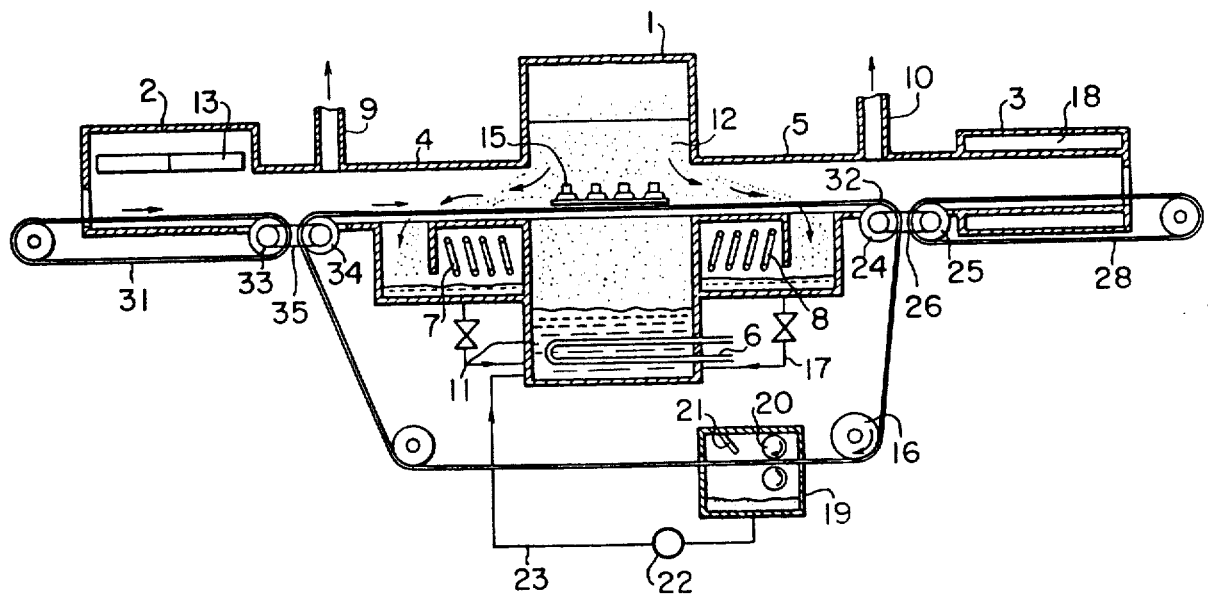
Figure 5:
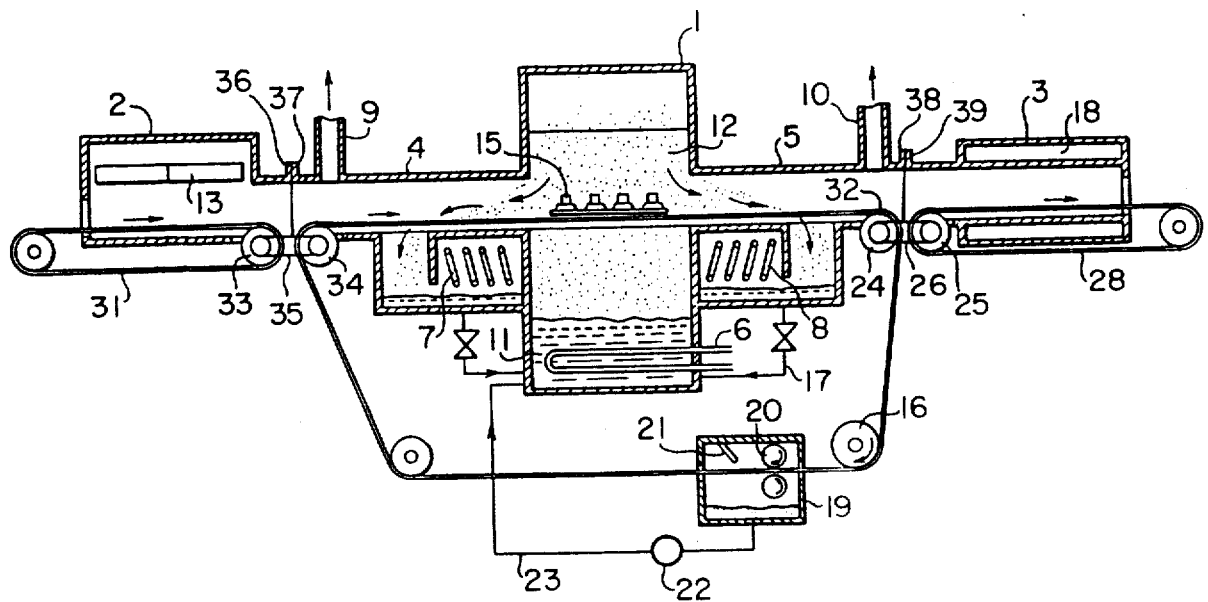
Figure 7:
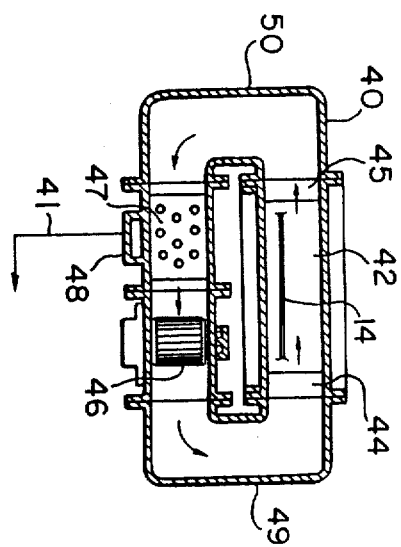
Figure 6:
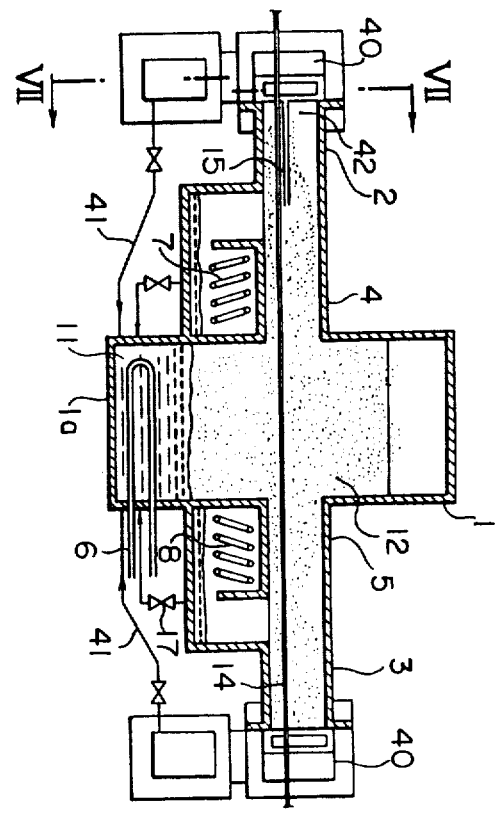

FIGS. 6 and 7 show another embodiment of the invention, in which an air curtain means 40 is provided for shutting out any leakage of the saturated vapor into an opening portions of the inlet and outlet of the delivery paths.

The air curtain means 40 is shown in detail in FIG. 7. In FIG. 7, there are shown a discharge nozzle 44 for spraying a recirculation air to form an air curtain, an inspiration nozzle 45 for inspirating the air flow, an electrically driven fan for generating the recirculation air flow, a thermal medium cooling means 47 in cooperation with the thermal medium collecting and cooling means for condensing the thermal medium mixed into the air curtain of the recirculation air flow, and a thermal medium pan 48 for collecting therein the condensed and liquefied thermal medium. The thermal medium cooling means 47 and the thermal medium pan 48 are located below the air curtain means for easy collection of the thermal medium.

Reference numeral 49 denotes a duct for air recirculation and fluid communication between the attachment section of the electrically driven fan 46 and the discharge nozzle 44 and reference numeral 50 denotes a duct for air recirculation and fluid communication between the inspiration nozzle 45 and the thermal medium cooling means 47. Also, reference numeral 41 denotes a pipe for connecting the thermal medium pan 48 and the vapor generating tank 1a.

The operation of the thus constructed vapor reflow type soldering apparatus, in particular of the air curtain means 40 and the thermal medium cooling and collecting means will now be described.

The air accelerated and pressurized by the electrically driven fan 46, as shown by the arrows in FIG. 7, passes through the duct 49 and reaches the discharge nozzle 44. Further, the air is rectified and accelerated by the fan 46 and is allowed to flow along the front surface of the opening 42 to form an air curtain.

The saturated vapor 12 of the thermal medium travelling from the vapor chamber 1 to the delvery path (the inlet side delivery path 2 in FIG. 7) is prevented by the air curtain from leaking to the outside, and a part of the saturated vapor is mixed into the recirculation air flow of the air curtain.

The air entraining the saturated vapor of the thermal medium inspired into the inspiration nozzle 45 is caused to pass through the duct 50 and to be led into the thermal medium cooling means 47 to be cooled. The air is accelerated and pressurized by the electrically driven fan 46. The cyclic operation thereof is repeated.

The saturated vapor of the thermal medium entrained in the air is condensed and liquefied to be stagnant in the thermal medium pan 48 when being cooled by the thermal medium cooling means 47. The liquefied thermal medium stagnant in the thermal medium pan 48 is suitably controlled in level. When the liquefied thermal medium reaches a predetermined level, the thermal medium is collected to the thermal medium reservoir section of the vapor generating tank 1a through the return pipe 41. Although the explanation has been made as to the air curtain means located at the opening portion 42 of the inlet side delivery path 2, the curtain means provided at the opening portion of the outlet side delivery path 3 is operated in the same manner.

According to this embodiment, the following advantages are ensured.

(1) Since the air curtain covers the whole opening portion, there is little contact between the inner atmosphere within the soldering apparatus and the outside atmosphere. Thus, the leakage of the saturated vapor of the thermal medium may be effectively prevented.

(2) The small amount of the saturated vapor of the thermal medium entrained and mixed into the air flow of the air curtain is collected by the thermal medium cooling means 47. Therefore, it is possible to reduce the leakage amount of the thermal medium to the outside atmosphere to an extremely low level, so that the consumption of the expensive thermal medium is suppressed, thus reducing the running cost.

Also, the amount of leaked saturated vapor of the thermal medium is very small and a safety aspect is improved.

(3) If the temperature of the air curtain is suitably controlled, it is possible to accelerate or suppress the preheating and cooling of the solder member. As an additional advantage, it is possible to reduce a thermal problem inherent in the solder member.

(4) Since the air amount of the air curtain is independently equilibrated in either side of the inlet and outlet paths, air invasion into the soldering apparatus is small in the delivery paths or the vapor tank 1. The flow of the saturated vapor 12 is hardly turbulent.

According to the present invention, the thermal medium adhered to the conveyor travelling out of the vapor tank is removed. Therefore, the generation of a poisonous gas is prevented, thus enhancing the safety property. Also, according to the invention, the leakage of the saturated vapor of the thermal medium is reduced to a minimum possible level, and the collection of the thermal medium is improved to a maximum possible level. Thus, consumption of an expensive thermal medium is suppressed, thereby reducing the running cost.

What is claimed is:

1. An apparatus for fixing electronic parts to a printed circuit board, having a vaport tank in which a soldering operation is carried out by bringing a saturated vapor of thermal medium into contact with a material to be processed and delivered by a conveyor, whereby the thermal medium condenses and liquefies on the conveyor, adhering to the conveyor, and delivery paths through which the material to be processed is fed into and discharged from said vapor tank, said apparatus further comprising a rotary brush for collecting liquefied thermal medium adhered to said conveyor travelling out of said vapor tank by removing it from said conveyor for reuse.

2. The apparatus according to claim 1, further comprising a cooling chamber provided on an outlet side of said vapor tank.

3. The apparatus according to claim 2, further comprising a preheating chamber provided on an inlet side of said vapor tank.

4. The apparatus according to claim 3, wherein said conveyor is divided into a conveyor element for said preheating chamber and said vapor tank, and another conveyor element for said cooling chamber, while their travelling speeds are in synchronism with each other, and said rotary brush is provided in a midway of the conveyor element for said preheating chamber and said vapor tank.

5. The apparatus according to claim 1, further comprising a preheating chamber provided on an inlet side of said vapor tank.

6. An apparatus for fixing electronic parts to a printed circuit board, having a vapor tank in which a soldering operation is carried out by bringing a saturated vapor of thermal medium into contact with a material to be processed and delivered by a conveyor, whereby the thermal medium condenses and liquefies on the conveyor, adhering to the conveyor, a preheating chamber provided on an inlet side of said vapor tank, a cooling chamber provided on an outlet side of said vapor tank, and delivery paths through which the material to be processed is fed into and discharged from said vapor tank, said apparatus comprising collecting means for collecting the liquefied thermal medium adhered to the conveyor travelling out of said vapor tank, wherein said collecting means includes rotary brushes for removing liquefied thermal medium from the conveyor.

7. The apparatus according to claim 6, wherein said collecting means further includes an air knife for removing liquefied thermal medium from the conveyor.

8. An apparatus for fixing electronic parts to a printed circuit board, having a vapor tank in which a soldering operation is carried out by bringing a saturated vapor of thermal medium into contact with a material to be processed and delivered by a conveyor, whereby the thermal medium condenses and liquefies on the conveyor, adhering to the conveyor, a preheating chamber provided on an inlet side of said vapor tank, a cooling chamber provided on an outlet side of said vapor tank, and delivery paths through which the material to be processed is fed into and discharged from said vapor tank, said apparatus comprising collecting means for collecting the liquefied thermal medium adhered to the conveyor travelling out of said vapor tank, wherein said collecting means includes an air knife for removing liquefied thermal medium from the conveyor.

9. An apparatus for fixing electronic parts to a printed circuit board, having a vapor tank in which a soldering operation is carried out by bringing a saturated vapor of thermal medium into contact with a material to be processed and delivered by a conveyor, whereby the thermal medium condenses and liquefies on the conveyor, adhering to the conveyor, a preheating chamber provided on an inlet side of said vapor tank, a cooling chamber provided on an outlet side of said vapor tank, and delivery paths through which the material to be processed is fed into and discharged from said vapor tank, said apparatus comprising collecting means for collecting the liquefied thermal medium adhered to the conveyor travelling out of said vapor tank, wherein said conveyor is a continuous conveyor travelling at least through said preheating chamber and said vapor tank, the material being removed from the conveyor at a location after passing through the vapor tank, and wherein said collecting means is located at a position after the location where the material is removed but prior to passage into the preheating chamber.

* * * * *

UNITED STATES PATENT AND TRADEMARK OFFICE
CERTIFICATE OF CORRECTION

PATENT NO. : 4,776,105

DATED : October 11, 1988

INVENTOR(S) : Mishina, et al.

It is certified that error appears in the above-identified patent and that said Letters Patent is hereby corrected as shown below:

On Title Page: of the above-identified U.S. Patent, right-hand column, last line, delete "No Drawings" and substitute therefor --7 Drawing Figures--.

Insert the following six (6) sheets of formal drawings (Figures 1 through 7) in the above-identified U.S. Patent.

Signed and Sealed this

Twenty-fifth Day of February, 1992

Attest:

HARRY F. MANBECK, JR.

*Attesting Officer*      Commissioner of Patents and Trademarks